(12) United States Patent
Yoon et al.

(10) Patent No.: US 10,026,614 B2
(45) Date of Patent: Jul. 17, 2018

(54) METHOD FOR MANUFACTURING SEMICONDUCTOR DEVICE

(71) Applicant: SAMSUNG ELECTRONICS CO., LTD., Suwon-si, Gyeonggi-do (KR)

(72) Inventors: Chan Sic Yoon, Anyang-si (KR); Ki Seok Lee, Busan (KR); Dong Oh Kim, Daegu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/291,415

(22) Filed: Oct. 12, 2016

(65) Prior Publication Data

US 2017/0213724 A1 Jul. 27, 2017

(30) Foreign Application Priority Data

Jan. 26, 2016 (KR) .................. 10-2016-0009217

(51) Int. Cl.
*H01L 21/027* (2006.01)
*H01L 21/033* (2006.01)
*H01L 21/308* (2006.01)
*H01L 21/3213* (2006.01)
*H01L 21/8234* (2006.01)

(52) U.S. Cl.
CPC ...... *H01L 21/0276* (2013.01); *H01L 21/0337* (2013.01); *H01L 21/3086* (2013.01); *H01L 21/32139* (2013.01); *H01L 21/823431* (2013.01); *H01L 21/823481* (2013.01)

(58) Field of Classification Search
CPC .................................................. H01L 21/0276
See application file for complete search history.

(56) References Cited

U.S. PATENT DOCUMENTS

| 7,709,396 | B2 | 5/2010 | Bencher et al. |
| 7,998,357 | B2 | 8/2011 | Cho et al. |
| 8,048,812 | B2 | 11/2011 | Tran et al. |
| 8,735,296 | B2 * | 5/2014 | Jung .............. H01L 21/823456 216/72 |

(Continued)

FOREIGN PATENT DOCUMENTS

| JP | 2011-071448 A | 4/2011 |
| KR | 10-2008-0034234 A | 4/2008 |
| KR | 10-2009-0066929 A | 6/2009 |

(Continued)

*Primary Examiner* — Duy Vu N Deo
(74) *Attorney, Agent, or Firm* — Lee & Morse, P.C.

(57) ABSTRACT

A method for manufacturing a semiconductor device includes forming features of a first mold pattern on a substrate including a first region and a second region, and forming a first insulation layer covering the first mold pattern from the first region to the second region. The method further includes forming a photoresist pattern on the first insulation layer in the second region, forming a second insulation layer covering the first insulation layer in the first region and the photoresist pattern in the second region from the first region to the second region, etching the second insulation layer, removing the photoresist pattern, and forming a first double patterning technology pattern having a first width in the first region and a second DPT pattern having a second width in the second region, wherein the second width is different from the first width.

20 Claims, 29 Drawing Sheets

(56) References Cited

U.S. PATENT DOCUMENTS

2015/0200110 A1   7/2015  Li et al.

FOREIGN PATENT DOCUMENTS

| KR | 10-2009-0089497 A | 8/2009 |
| KR | 10-2009-0102165 A | 9/2009 |
| KR | 10-2009-0103520 A | 10/2009 |
| KR | 10-2009-0105020 A | 10/2009 |
| KR | 10-2009-0124327 A | 12/2009 |
| KR | 10-2010-0001813 A | 1/2010 |
| KR | 10-2010-0006012 A | 1/2010 |

* cited by examiner

1200

1300

1400

METHOD FOR MANUFACTURING SEMICONDUCTOR DEVICE

CROSS-REFERENCE TO RELATED APPLICATION

Korean Patent Application No. 10-2016-0009217, filed on Jan. 26, 2016, and entitled, "Method for Manufacturing Semiconductor Device," is incorporated by reference herein in its entirety.

BACKGROUND

1. Field

One or more embodiments described herein relate to a method for manufacturing a semiconductor device.

2. Description of the Related Art

Producing highly integrated semiconductor devices continues to be a goal of designers. In order to advance this goal, patterns for semiconductor devices have been made finer and finer. For example, many attempts have been made to overcome the resolution limit of photolithography processing for forming patterns for implementing semiconductor devices. In particular, double patterning technology has allowed for finer patterns beyond the resolution limit of photolithography processing. However, drawbacks still exist.

SUMMARY

In accordance with one or more embodiments, a method for manufacturing a semiconductor device includes forming features of a first mold pattern on a substrate including a first region and a second region; forming a first insulation layer covering the first mold pattern from the first region to the second region; forming a photoresist pattern on the first insulation layer in the second region; forming a second insulation layer covering the first insulation layer in the first region and the photoresist pattern in the second region from the first region to the second region; etching the second insulation layer; removing the photoresist pattern; and forming a first double patterning technology (DPT) pattern having a first width in the first region and a second DPT pattern having a second width in the second region, wherein the second width is different from the first width.

In accordance with one or more other embodiments, a method for manufacturing a semiconductor device includes forming features of a mold pattern on a substrate including a first region and a second region; forming a first insulation layer covering the mold pattern from the first region to the second region; forming a photoresist pattern on the first insulation layer in the second region; forming a second insulation layer covering the first insulation layer in the first region and the photoresist pattern in the second region from the first region to the second region; etching the second insulation layer; removing the photoresist pattern; and forming first trenches having a first pitch in the first region and second trenches having a second pitch in the second region, wherein the second pitch is different from the first pitch.

In accordance with one or more other embodiments, a method for manufacturing a semiconductor device includes forming features of a mold pattern on a substrate; forming a first insulation layer covering the mold pattern over the substrate; forming a first photoresist pattern in a first region of the substrate; forming a second insulation layer over the substrate; etching the second insulation layer and the first photoresist pattern; forming a second photoresist pattern in a second region of the substrate; forming a third insulation layer over the substrate; etching the third insulation layer and the second photoresist pattern; forming a first double patterning technology (DPT) pattern having a first width in the first region and a second DPT pattern having a second width in the second region; and forming a third DPT pattern having a third width in another region of the substrate.

In accordance with one or more other embodiments, a method for manufacturing a semiconductor device includes forming features of a mold pattern on a substrate; forming a first insulation layer covering the mold pattern; forming a first photoresist pattern in a first region of the substrate; forming a second insulation layer over the substrate; etching the second insulation layer and the first photoresist pattern; forming a second photoresist pattern in a second region of the substrate; forming a third insulation layer over the substrate; etching the third insulation layer and the second photoresist pattern; forming first trenches with a first pitch in the first region and second trenches with a second pitch in the second region; and forming third trenches with a third pitch in another region of the substrate.

In accordance with one or more other embodiments, a method for making a semiconductor device includes forming a plurality of first spacers in a first region; and forming a plurality of second spacers in a second region adjacent to the first region, wherein each of the first spacers includes a portion of a first insulation layer and a portion of a second insulation layer and each the second spacers includes a portion of the first insulation layer without a portion of the second insulation layer and wherein each of the second spacers being wider than each of the first spacers.

BRIEF DESCRIPTION OF THE DRAWINGS

Features will become apparent to those of skill in the art by describing in detail exemplary embodiments with reference to the attached drawings in which.

DETAILED DESCRIPTION

FIGS. 1 to 12 illustrate various stages of an embodiment of a method for manufacturing a semiconductor device.

Figure 1:
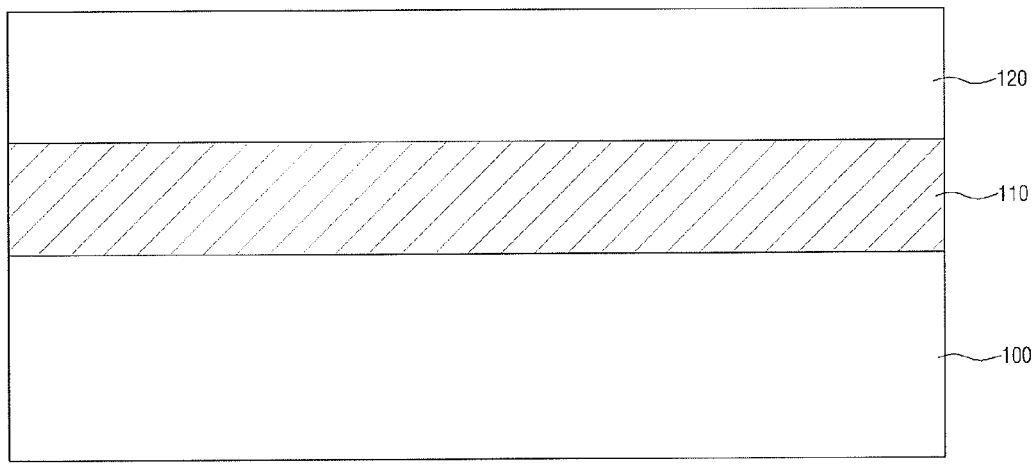
FIGS. 1 to 12 illustrate an embodiment of a method for manufacturing a semiconductor device.

Referring to FIG. 1, a layer to be etched 110 is formed on a substrate 100, and a first hard mask layer 120 is formed on the layer to be etched 110. The substrate 100 may be a high density pattern area where pattern density per area is relatively high, e.g., where a pattern is formed at a density higher than the resolution limit of photolithography processing. For example, the substrate 100 may be a cell array area of a semiconductor device or a periphery circuit area that has lower pattern density per area. In some exemplary embodiments, the substrate 100 may be a silicon substrate.

The layer to be etched 110 may be made of a variety of materials, for example, depending on the use of a pattern to be formed. For example, if a gate electrode is to be formed on the substrate 100, the layer to be etched 110 may be a conductive layer, such as a doped polysilicon layer or a stack of doped polysilicon layer and a metal silicide layer. If a bit line is to be formed on the substrate 100, the layer to be etched 110 may be made of metal such as tungsten or aluminum. In one embodiment, the layer to be etched 110 may be formed as a combination of a conductive layer and an insulation layer. The layer to be etched 110 may be eliminated, for example, if a resulting fine pattern is formed by etching the substrate 100 itself. For example, the layer to be etched 110 may be eliminated if the method of the exemplary embodiment is used for defining an active region in the substrate 100.

The first hardmask layer 120 may be made of a variety of material, for example, depending on the material of the layer to be etched 110 or another etch mask formed on the first hardmask layer 120 in a subsequent process or depending on the use of a pattern to be formed. The first hardmask layer 120 may therefore have an etch resistance during the process of etching its underlying layer. In some exemplary embodiments, the first hardmask layer 120 may include an oxide film, a nitride film or a polysilicon film. In some embodiments, the first hardmask layer 120 may be a single layer containing one type of material or may be multiple layers of different materials.

Figure 2:
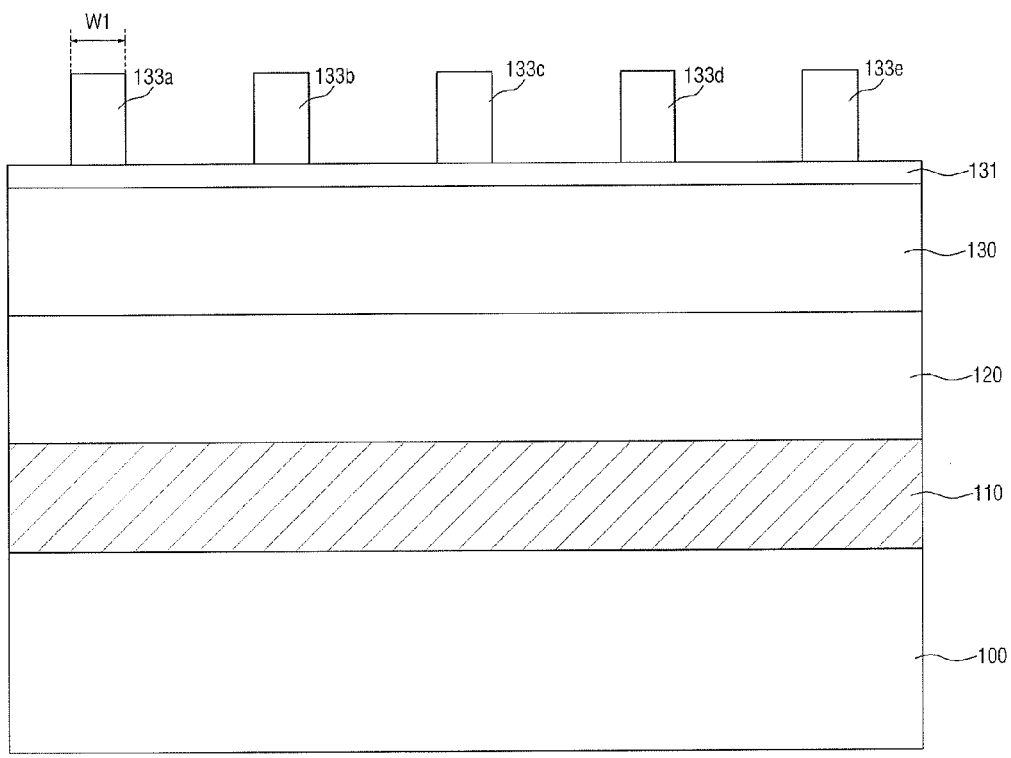

Referring to FIG. 2, a mold layer 130 is formed on the first hardmask layer 120 and then a first anti-reflection layer 131 is formed on the mold layer 130. Subsequently, a photoresist pattern 133a to 133e is formed on the first anti-reflection layer 131.

The first hardmask layer 120 may be made of, for example, a carbon-containing film, an oxide film, a polysilicon film, a nitride film, a photoresist film, or a metal film such as aluminum (Al) or tungsten (W). If the mold layer 130 is made of a carbon-containing film, the carbon-containing film of the first hardmask layer 120 may be made of an organic compound composed of a hydrocarbon compound including aromatic ring or a derivative thereof. For example, the carbon-containing film of the first hardmask layer 120 may be made of an organic compound containing aromatic ring such as phenyl, benzene, or naphthalene. The carbon-containing film may have a relatively high carbon content of, e.g., approximately 85 to 99% by weight with respect to the total weight of the organic compound of the first hard mask layer 120. The carbon-containing film may be formed by, for example, spin coating.

The first anti-reflection layer 131 may be made of an inorganic or organic material. For example, the first anti-reflection layer 131 may be made of a SiON film or a bottom anti-reflective coating (BARC) film.

Figure 3:
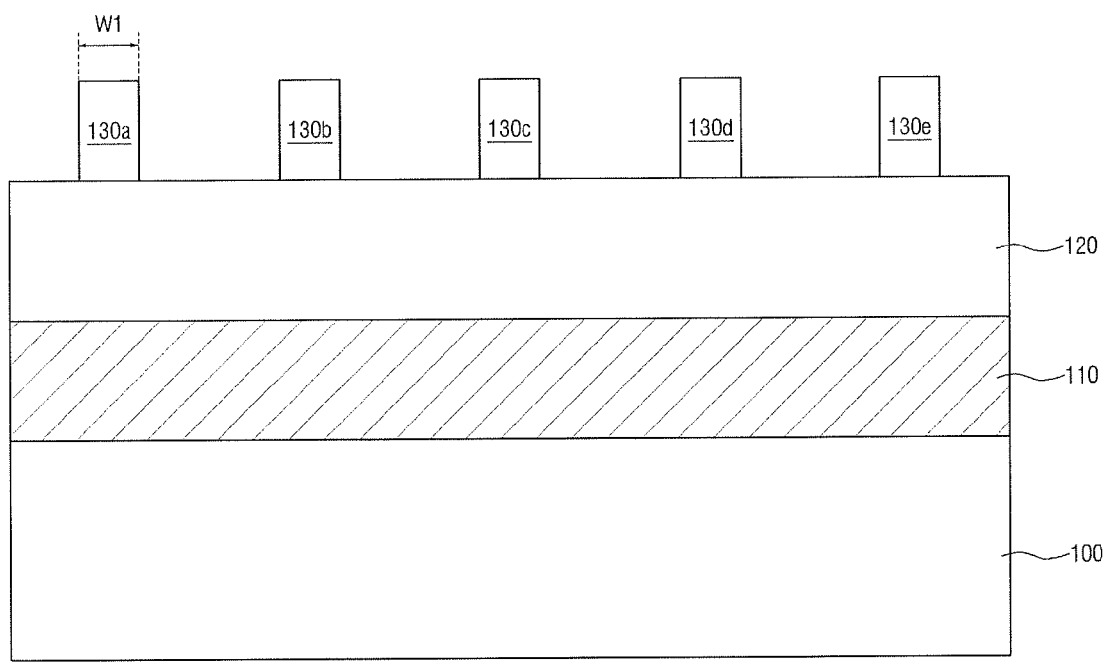

Referring to FIG. 3, the first anti-reflection film 131 and the mold layer 130 are etched using the photoresist pattern 133a to 133e as an etch mask to form a first mold pattern 130a to 130e. Subsequently, the first anti-reflection film 131 and the photoresist pattern 133a to 133e remaining on the first mold pattern 130a to 130e may be removed. Each of the features of the first mold pattern 130a to 130e may have a width of W1. In some embodiments, the features of first mold patterns may have different widths.

Figure 4:
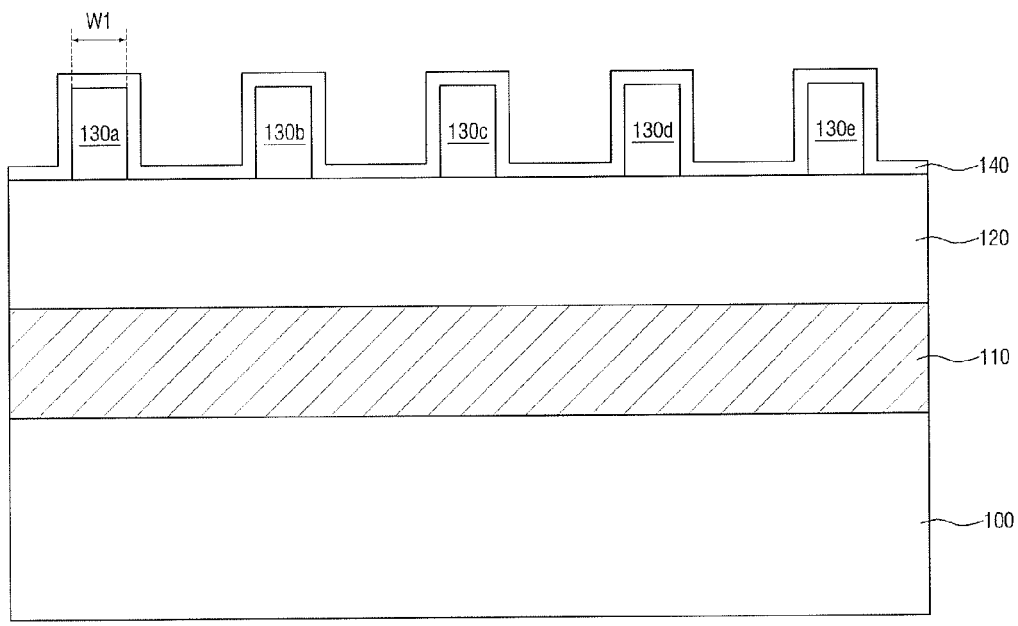

Referring to FIG. 4, a first insulation layer 140 is formed on the first mold pattern 130a to 130e and the first hard mask layer 120. The first insulation layer 140 covers the top surface and side walls of each of the features of the first mold pattern 130a to 130e and the top surface of first hard mask layer 120 with a uniform thickness.

The first insulation layer 140 is made of a material having etch resistance during the processing of etching the first mold pattern 130a to 130e and the first hard mask layer 120. For example, the first insulation layer 140 may be an oxide film or a nitride film formed via an atomic layer deposition (ALD) process. In some embodiments, the first mold pattern 130a to 130e may be made of a carbon-containing film and the first insulation layer 140 may be made of an oxide film. In other embodiments, the first mold pattern 130a to 130e may be made of an oxide film and the first insulation layer 140 may be made of a nitride film.

Figure 5:
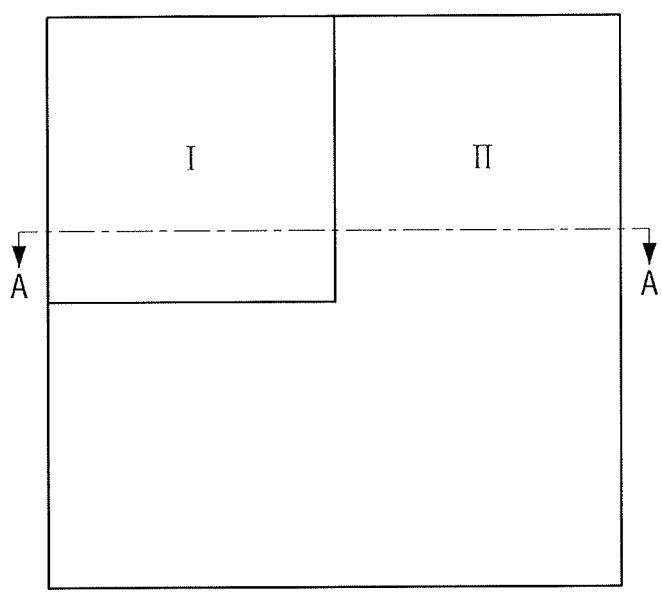

FIG. 5 is a top view of the substrate 100 illustrating a first region I and a second region II. The first region I includes a fine pattern formed by a double patterning technology (DPT) process. The size of the fine pattern may be adjusted based on any of exemplary method embodiments disclosed herein. The second region II includes a fine pattern formed by a DPT process. The size of the fine pattern is not adjusted. For example, the second region II may be covered by a photoresist pattern while the size of features of the pattern in the first region I are adjusted. An example is discussed with reference to FIGS. 6 to 12.

Figure 6:
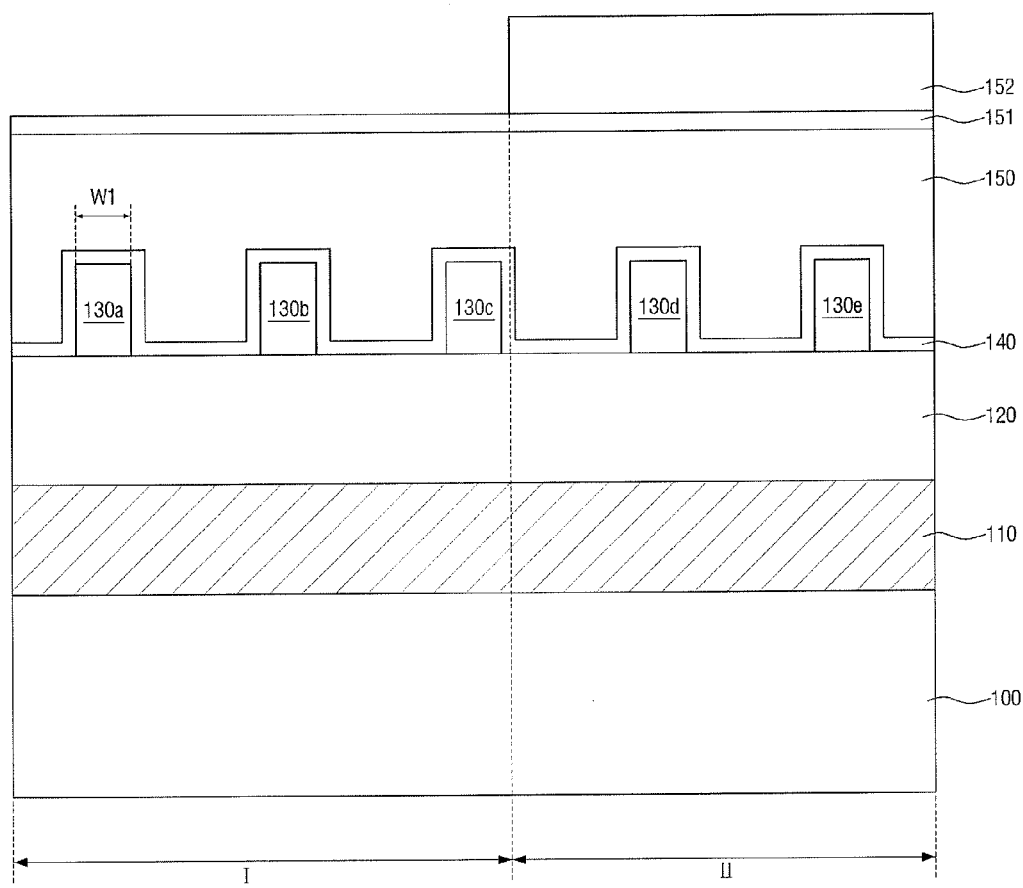

Referring to FIG. 6, which shows a cross-section along line A-A in FIG. 5, a second hard mask layer 150 is foiled over the substrate 100 to cover the first insulation layer 140. Then, a second anti-reflection film 151 is formed on the second hardmask layer 150, and a photoresist pattern 152 in a predetermined shape is formed on the second anti-reflection film 151.

The second hardmask layer 150 may be made of a carbon-containing film, e.g., one including an organic compound composed of hydrocarbon compound including aromatic ring or a derivative thereof. For example, the carbon-containing film of the second hardmask layer 150 may be made of an organic compound containing aromatic ring, e.g., phenyl, benzene or naphthalene. The carbon-containing film may have a relatively high carbon content of, e.g., approximately 85 to 99% by weight with respect to the total weight of the organic compound of the second hard mask layer 150. The carbon-containing film may be formed by, for example, spin coating.

The second anti-reflection layer 151 may be made of an inorganic or organic material. For example, the first anti-reflection layer 151 may be made of a SiON film or a bottom anti-reflective coating (BARC) film.

As described with reference to FIG. 5, the photoresist pattern 152 may separately define the first region I, where the size of a fine pattern is adjusted during a DPT process, and the second region II where the size of a fine pattern is not adjusted. In some embodiments, the photoresist pattern 152 may include a kripton fluoride (KrF) resist pattern or an argon fluoride (ArF) resist pattern.

Figure 7:
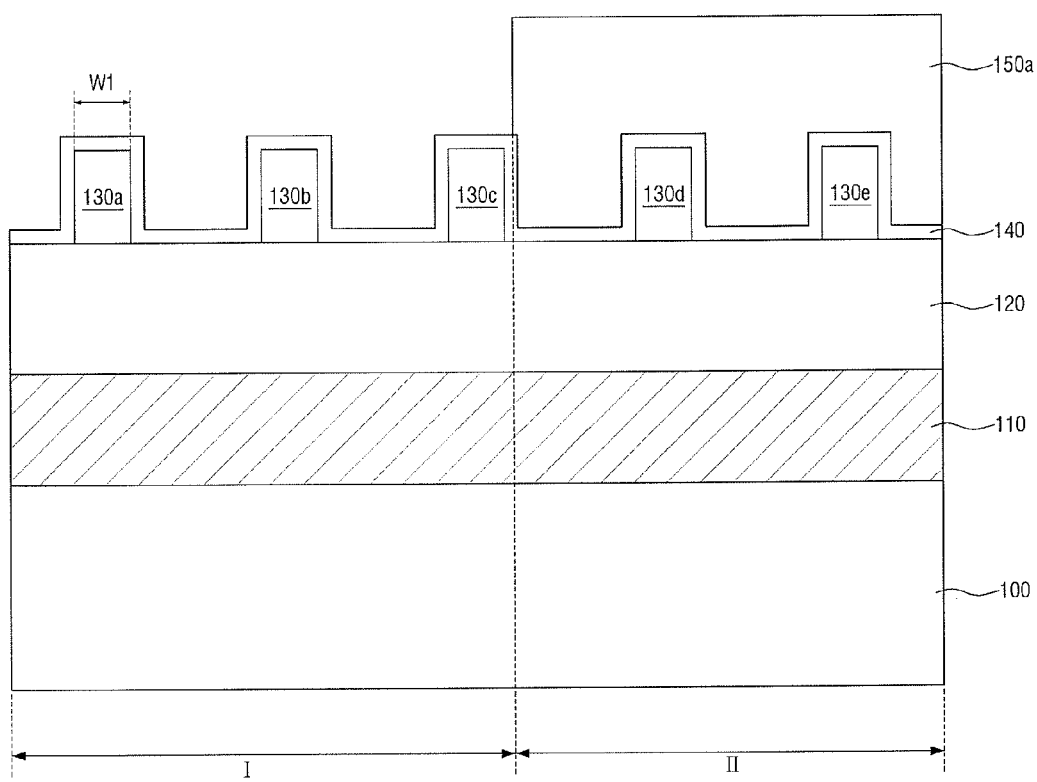

Referring to FIG. 7, the second anti-reflection film 151 and the second hardmask layer 150 are etched using the photoresist pattern 152 as an etch mask to form a second hardmask pattern 150a. The second anti-reflection film 151 and the photoresist pattern 152 remaining on the second hardmask pattern 150a may then be removed.

Figure 8:
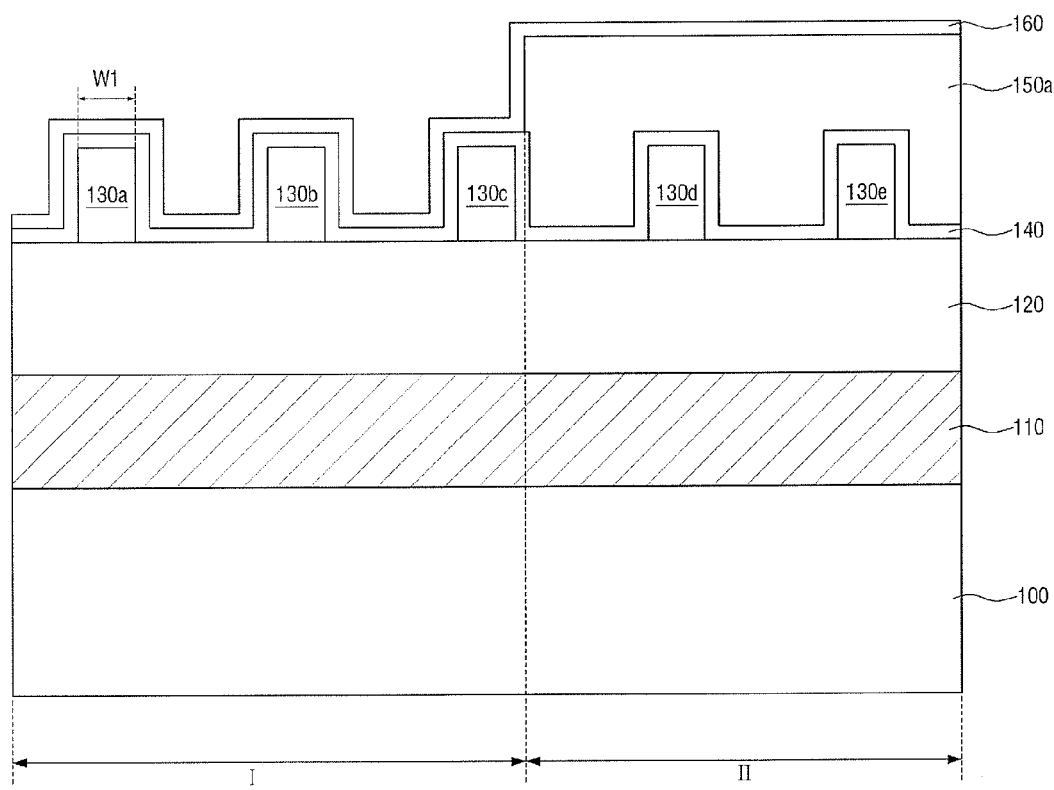

Referring to FIG. 8, a second insulation layer 160 is formed on the first insulation layer 140 and the second hardmask pattern 150a. The second insulation layer 160 covers the top surface and side walls of each of the first insulation layer 140 and the top surface and side walls of the first hardmask layer 120 with a uniform thickness. The second insulation layer 160 is made of a material having etch resistance during the processing of etching the first mold pattern 130a to 130e and the first hard mask layer 120. For example, the second insulation layer 160 may be an oxide film or a nitride film formed via an atomic layer deposition (ALD) process.

Figure 9:
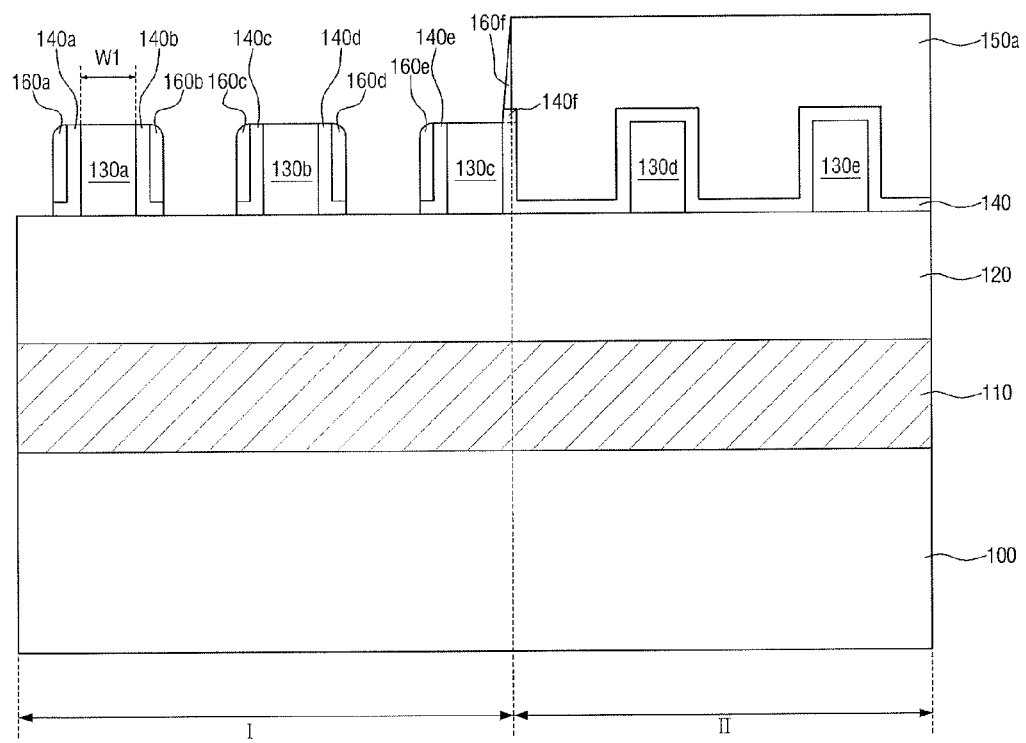

Referring to FIG. 9, the second insulation layer 160 is etched. For example, the second insulation layer 160 formed on the first insulation layer 140 is etched in the first region I and the second insulation layer 160 formed on the photoresist pattern 150a is etched in the second region II.

As the second insulation layer 160 is etched, a portion thereof formed on the top surface of each of the features of the first mold pattern 130a to 130e is removed. Portions thereof formed on the side walls of each of the features of the first mold pattern 130a to 130e may not be removed. Part of the first insulation layer 140 may be etched together during the process of etching the second insulation layer 160.

Accordingly, in the first region I of the first hardmask layer 120, first spacer patterns 140a to 140e and second spacer patterns 160a to 160e may be formed on the side walls of each of the features of the first mold pattern 130a to 130c, respectively. The first spacer pattern 140a to 140e and the second spacer pattern 160a to 160e may be used for forming a DPT pattern in the first region I in a subsequent process.

In addition, a residual part 160f of the second insulation layer 160 may be formed on a part 140f of the first insulation layer 140. The first region I and the second region II may be separated by the residual part 160f of the second insulation layer 160 as well as the boundary of the photoresist pattern 150a.

Figure 10:
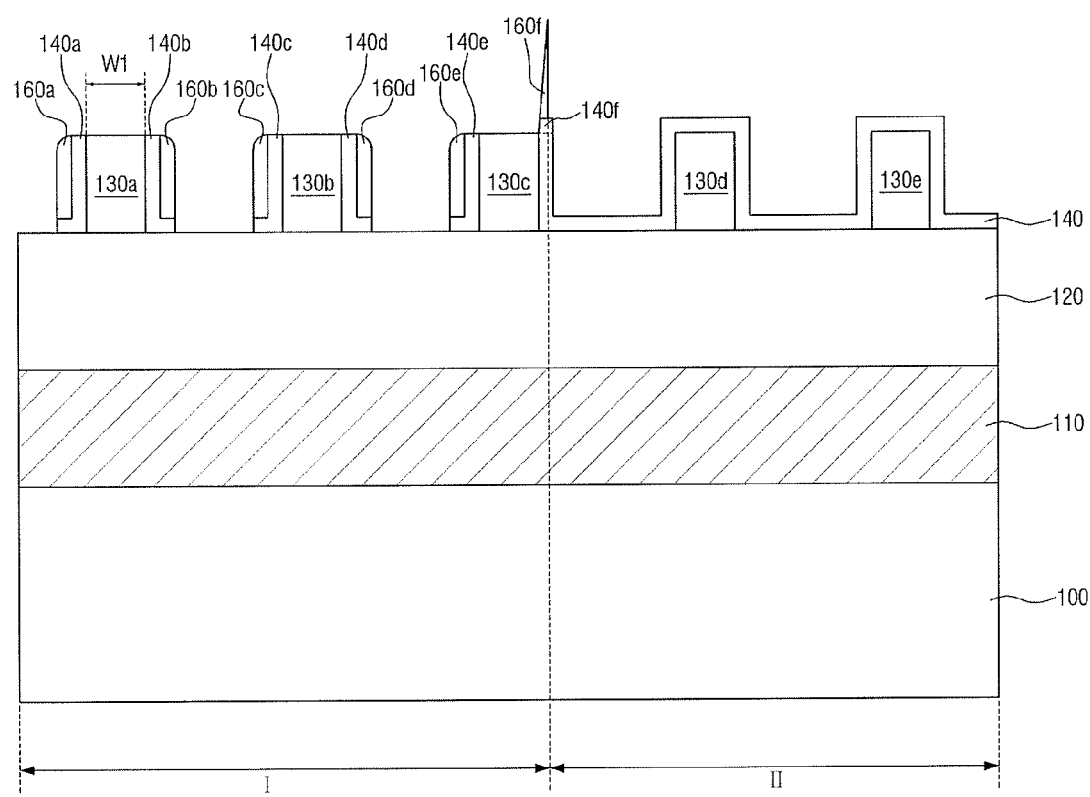

Referring to FIG. 10, the photoresist pattern 150a is etched out. As a result, the first insulation layer 140 is exposed in the second region II. Part of the first insulation layer 140 may be etched together during etching of the photoresist pattern 150a.

Figure 11:
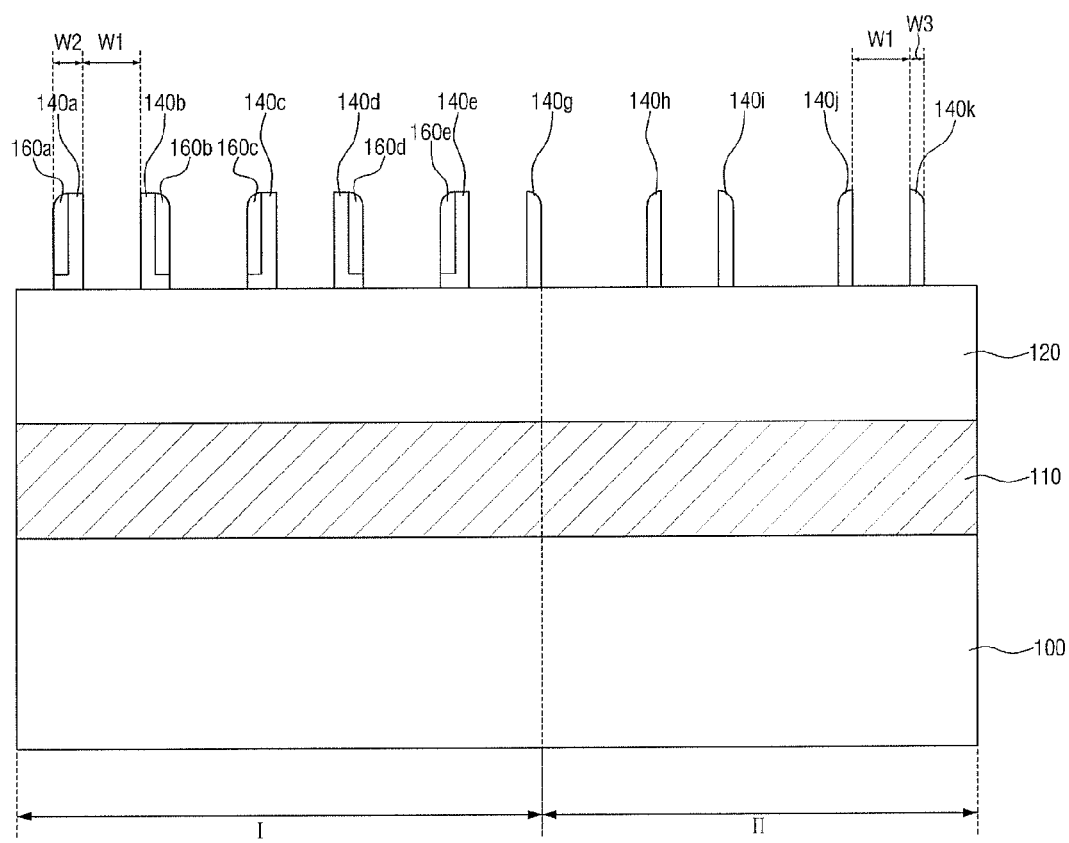

Referring to FIG. 11, the first mold pattern 130a to 130e is removed for forming a DPT pattern. As a result, in the first region I, the top surface of the first hardmask layer 120 is exposed between a pair of features of the first spacer pattern 140a and the second spacer pattern 160a and a pair of features of the second spacer pattern 140b and the second spacer pattern 160b, between the pair of the features of the first spacer pattern 140b and the second spacer pattern 160b and a pair of features of the first spacer pattern 140c and the first spacer pattern 160c, and so on. In the second region II, the top surface of the first hardmask layer 120 is exposed between every two features of the first spacer pattern 140h to 140k.

The first mold pattern 130a to 130e may be removed by dry etching, wet etching, or ashing processes.

As described above, the removed features of the first mold pattern 130a to 130e have the width of W1, the pairs of the features of the first spacer patterns 140a to 140e and the features of the second spacer pattern 160a to 160e, respectively, have the width of W2, and the features of the first spacer pattern 140h to 140k have the width of W3. Such spacer patterns may determine the width of a feature or a pitch between features of the DPT patterns in a subsequent process, allowing for various sizes of DPT patterns.

Figure 12:
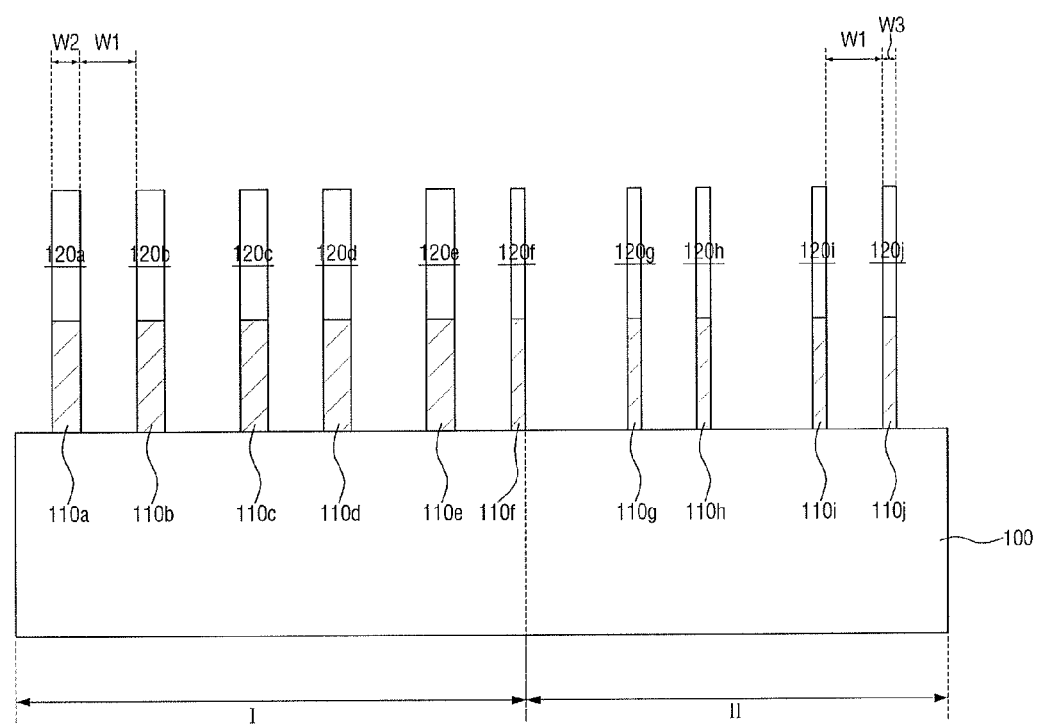

Referring to FIG. 12, the first spacer patterns 140a to 140e and the second spacer pattern 160a to 160e are used as etch masks in the first region I. The first spacer patterns 140h to 140k are used as an etch mask in the second region II, such that the first hardmask layer 120 is etched by anisotropic dry etching to thereby form fine patterns 110a to 110e and 110g to 110j in the layer to be etched 110. As a result, the first region I includes a fine pattern 110a to 110e having the width of W2 and the second region II includes a fine pattern 110g to 110j having the width of W3.

Thus, according to the present embodiment, by performing an additional photolithography process, after the first insulation layer 140 (which works as spacer material for the first DPT) is formed, different sizes of fine patterns may be formed in a desired region.

Figure 13:
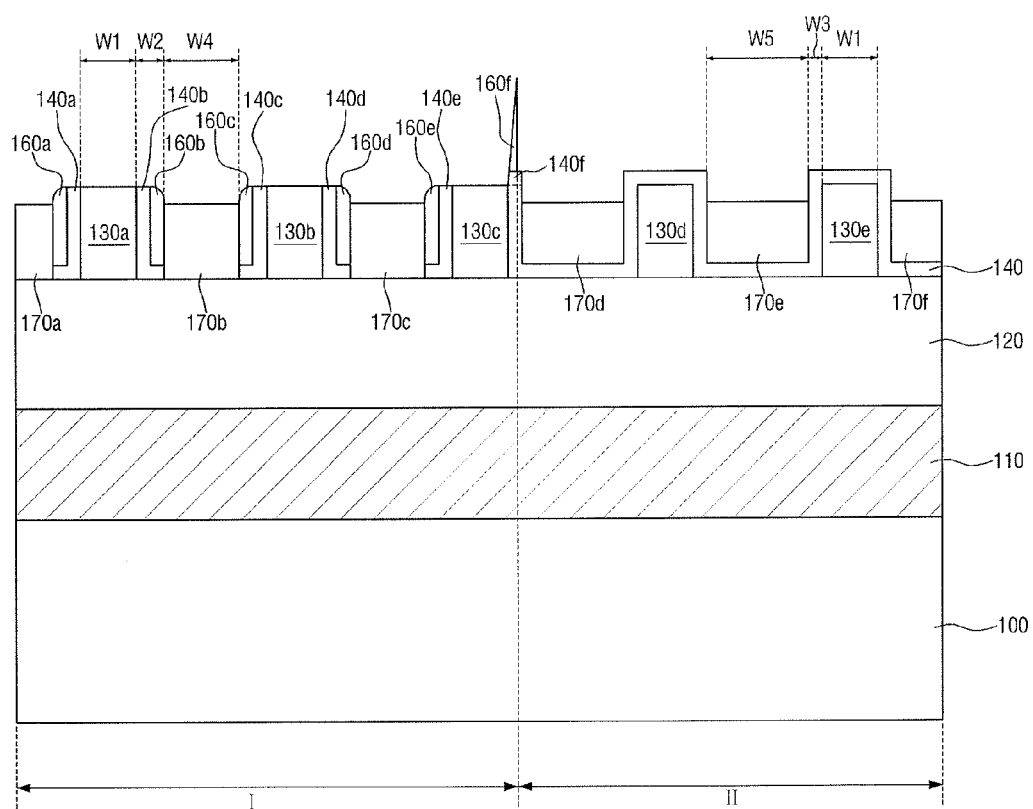
FIGS. 13 to 15 illustrate another embodiment of a method for manufacturing a semiconductor device.
Figure 14:
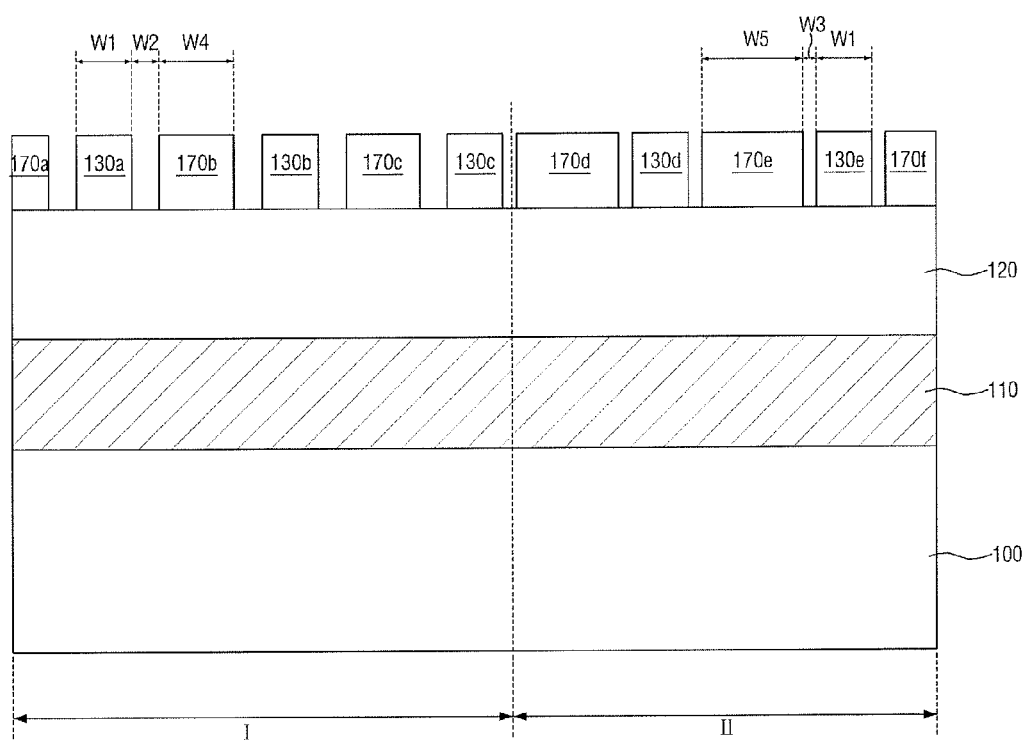
Figure 15:
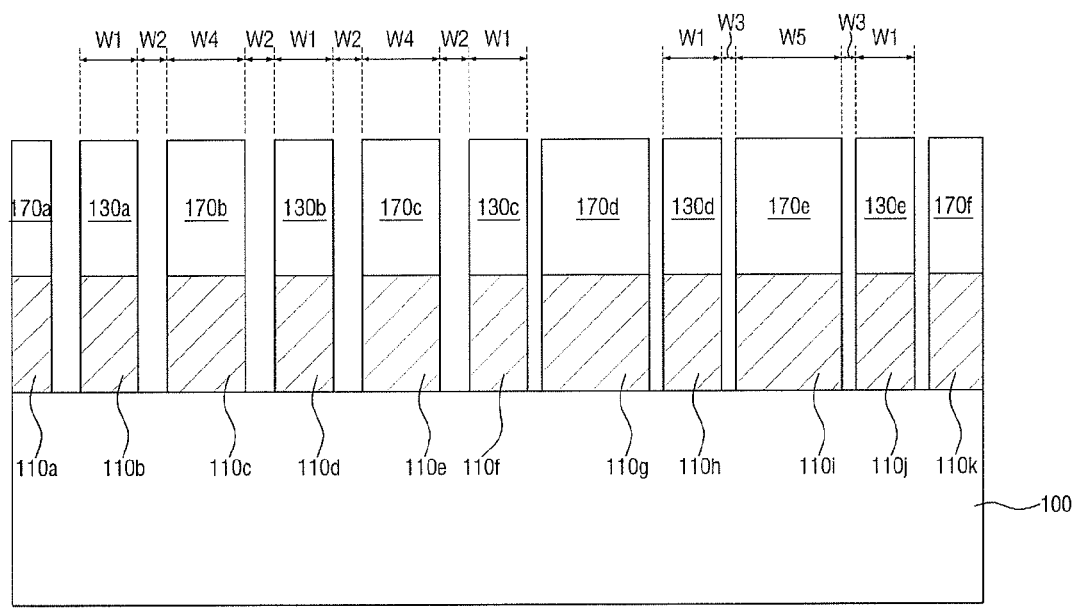

FIGS. 13 to 15 illustrate another embodiment of a method for manufacturing a semiconductor device. The processing operation in FIG. 13 is different from that in FIG. 10, in that a second mold pattern 170a to 170f is formed on the first hardmask layer 120, exposed between the pairs of the features of the first spacer pattern 140a to 140e and the features of the second spacer pattern 160a to 160e, respectively, in the first region I, and on the first insulation layer 140 exposed after the photoresist pattern 150a has been etched in the second region II.

Referring to FIG. 14, unlike FIG. 11, the first spacer pattern 140a to 140e and the second spacer pattern 160a to 160e are removed in the first region I and part of the first insulation layer 140 is removed in the second region II. As a result, the features of the first mold pattern 130a to 130e and the features of the second mold pattern 170a to 170f are alternately formed on the first hardmask layer 120.

Dry etching, wet etching or ashing processes may be used to remove the spacer pattern 140a to 140e, the second spacer pattern 160a to 160e and the first insulation layer 140.

In the first region I, the features of the first mold pattern 130a to 130c have the width of W1, the areas from which the first spacer pattern 140a to 14e and the second spacer pattern 160a to 160e have been removed have the width of W2, and the features of the second mold pattern 170b and 170c have the width of W4. In the second region II, the features of the first mold pattern 130a to 130c have the width of W1, the areas from which the first insulation layer 140 has been removed have the width of W3, and the features of the second mold pattern 170e have the width of W5. The mold patterns may determine the width of a feature or a pitch between features of the DPT patterns in a subsequent process, allowing for various sizes of DPT patterns.

Referring to FIG. 15, the first mold pacer pattern 130a to 130c and the second mold pacer pattern 170a to 170c are used as etch masks in the first region I. The first mold pattern 130d and 130e and the second mold pattern 170d to 170f are used as etch masks in the second region II. The first hardmask layer 120 is etched by anisotropic dry etching to thereby form fine pattern 110a to 110k in the layer to be etched 110.

As a result, the fine pattern in the first region I includes features 110b, 110d, and 110f having the width of W1 and features 110a, 110c, and 110e having the width of W4. The fine pattern in the second region II includes features 110h and 110j having the width of W1 and features 110g, 110i, and 110k having the width of W5, and these features are spaced apart from one another by the pitch of W3.

Thus, according to the present embodiment, by performing an additional photolithography process, after the first insulation layer 140 working as spacer material for the first DPT is formed, different sizes of fine patterns may be formed in a desired region.

Figure 16:
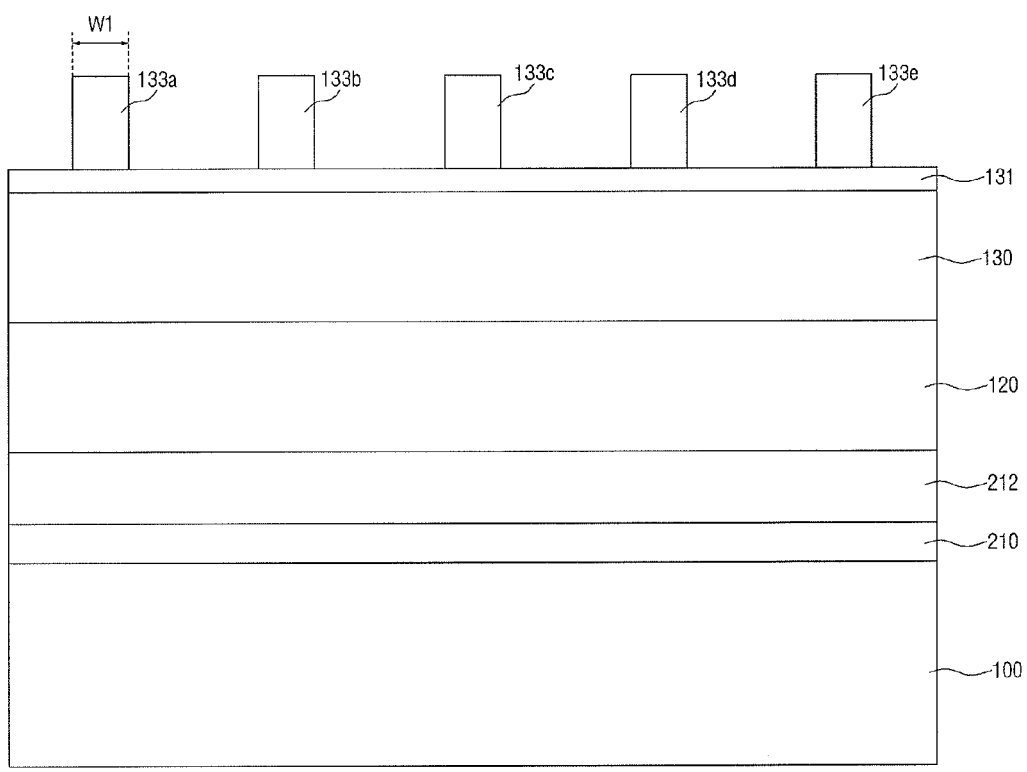
FIGS. 16 to 26 illustrate another embodiment of a method for manufacturing a semiconductor device.

FIGS. 16 to 26 illustrate another embodiment of a method for manufacturing a semiconductor device. Referring to FIG. 16, a pad oxide film 210 is formed on a substrate 100, a nitride film 212 is formed on the pad oxide film 210, and then a first hardmask layer 120 is formed on the nitride film 212.

The substrate 100 may be a highly dense pattern area where pattern density per area is relatively high, e.g., where a pattern is formed at a density higher than the resolution limit of photolithography processing. For example, the substrate 100 may be a cell array area of a semiconductor device or a periphery circuit area having a lower pattern density per area. In some exemplary embodiments, the substrate 100 may be a silicon substrate.

The first hardmask layer 120 may be made of a variety of materials, for example, depending on the material of the layer to be etched 110 or another etch mask formed on the first hardmask layer 120 in a subsequent process or depending on the use of a pattern to be formed. The first hardmask layer 120 may have an etch resistance during the process of etching its underlying layer. In some exemplary embodiments, the first hardmask layer 120 may include an oxide film, a nitride film, or a polysilicon film. In some embodiments, the first hardmask layer 120 may be a single layer containing one type of material or may be multiple layers of different materials.

Subsequently, a mold layer 130 is formed on the first hard mask layer 120 and then a first anti-reflection layer 131 is formed on the mold layer 130. A photoresist pattern 133a to 133e is then formed on the first anti-reflection layer 131. The first anti-reflection layer 131 may be made of an inorganic or organic material. For example, the first anti-reflection layer 131 may be made of a SiON film or a bottom anti-reflective coating (BARC) film.

Figure 17:
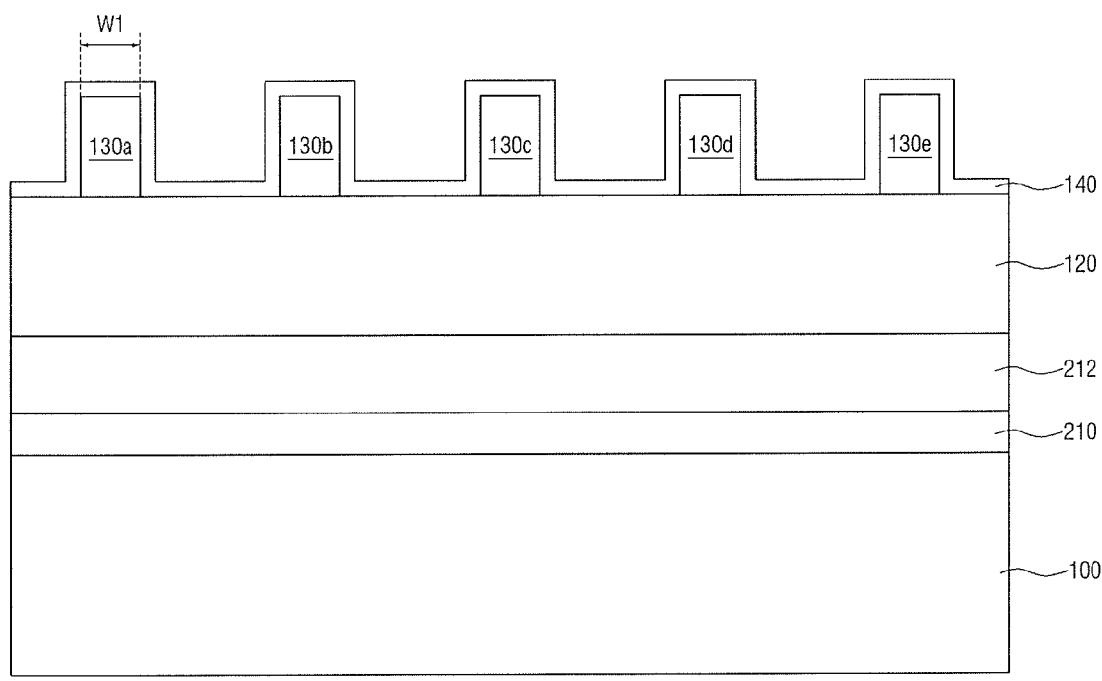

Referring to FIG. 17, the first anti-reflection film 131 and the mold layer 130 are etched, using the photoresist pattern 133a to 133e as etch masks, to form a first mold pattern 130a to 130e. Subsequently, the first anti-reflection film 131 and the photoresist pattern 133a to 133e remaining on the first mold pattern 130a to 130e may be removed. Each feature of the first mold pattern 130a to 130e may have a width W1.

Subsequently, a first insulation layer 140 is formed on the first mold pattern 130a to 130e and the first hard mask layer 120. The first insulation layer 140 is formed to cover the top surface and side walls of each of the features of the first mold pattern 130a to 130e and the top surface of the first hard mask layer 120 with a uniform thickness.

The first insulation layer 140 is made of a material having etch resistance during the processing of etching the first mold pattern 130a to 130e and the first hard mask layer 120. For example, the first insulation layer 140 may be an oxide film or a nitride film formed via an atomic layer deposition (ALD) process. In some embodiments, the first mold pattern 130a to 130e may be made of a carbon-containing film, and the first insulation layer 140 may be made of an oxide film. In some other embodiments, the first mold pattern 130a to 130e may be made of an oxide film and the first insulation layer 140 may be made of a nitride film.

Figure 18:
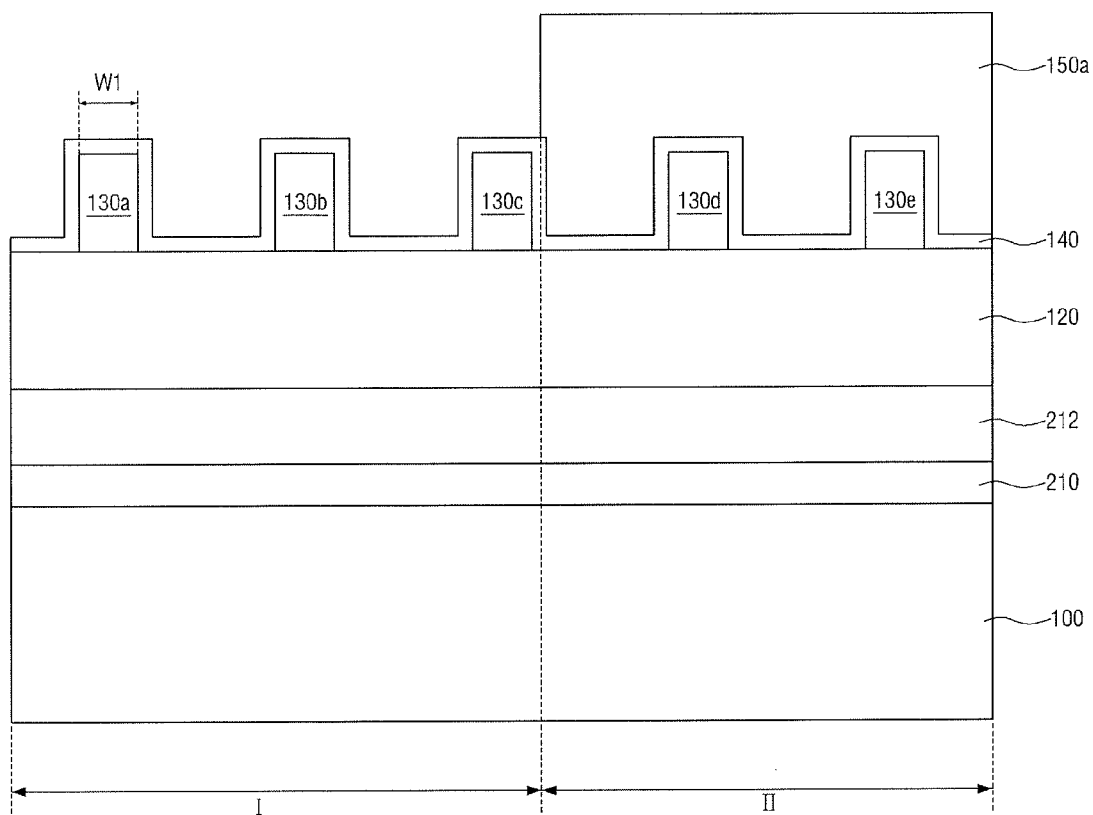

Referring to FIG. 18, a second hard mask layer 150 is formed over the substrate 100 to cover the first insulation layer 140. Then, a second anti-reflection film 151 is formed on the second hardmask layer 150, and a photoresist pattern 152 in a predetermined shape is formed on the second anti-reflection film 151. The second anti-reflection layer 151 may be made of an inorganic or organic material. For example, the first anti-reflection layer 151 may be made of a SiON film or a bottom anti-reflective coating (BARC) film.

As described with reference to FIG. 5, the photoresist pattern 152 may separately define the first region I, where the size of a fine pattern is adjusted during a DPT process, and the second region II where the size of a fine pattern is not adjusted. In some embodiments, the photoresist pattern 152 may include a kripton fluoride (KrF) resist pattern or an argon fluoride (ArF) resist pattern.

Subsequently, the second anti-reflection film 151 and the second hardmask layer 150 are etched using the photoresist pattern 152 as an etch mask to form a second hardmask pattern 150a. Subsequently, the second anti-reflection film 151 and the photoresist pattern 152 remaining on the second hardmask pattern 150a may be removed.

Figure 19:
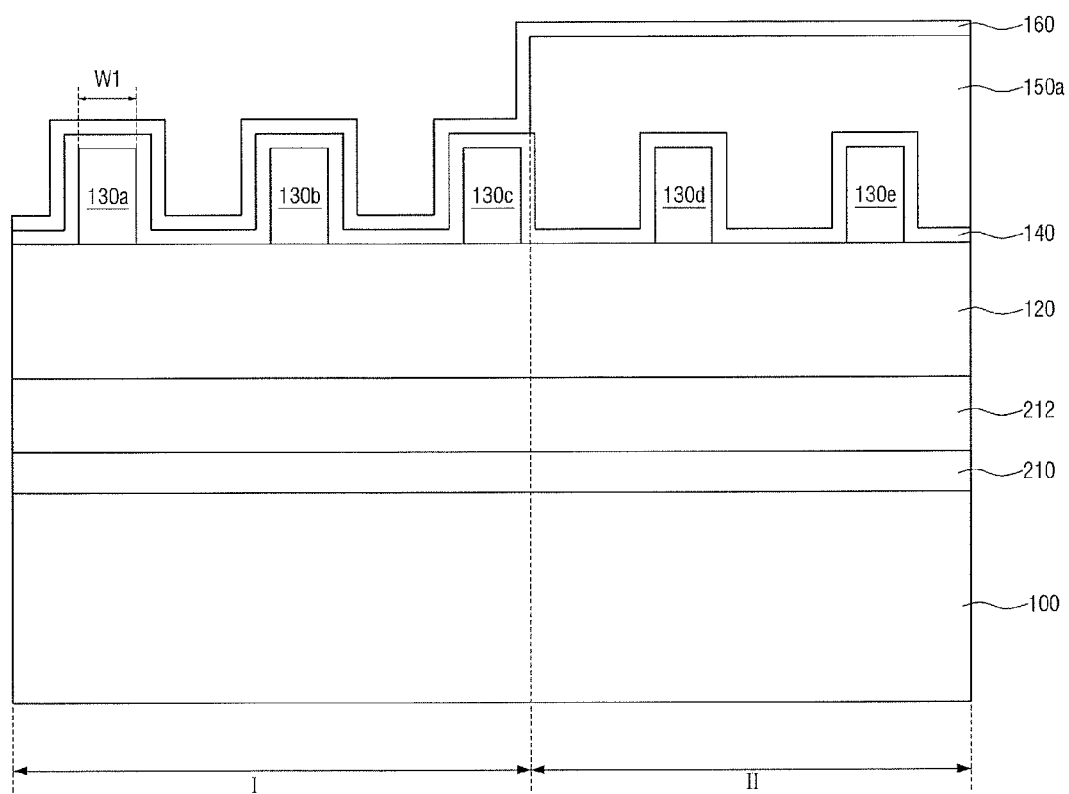

Referring to FIG. 19, a second insulation layer 140 is formed on the first insulation layer 140 and the second hardmask pattern 150a. The second insulation layer 160 is formed to cover the top surface and side walls of each of the first insulation layer 140 and the top surface and side walls of the first hardmask layer 120 with a uniform thickness. The second insulation layer 160 is made of a material having etch resistance during the processing of etching the first mold pattern 130a to 130e and the first hard mask layer 120. For example, the second insulation layer 160 may be an oxide film or a nitride film formed via an atomic layer deposition (ALD) process.

Figure 20:
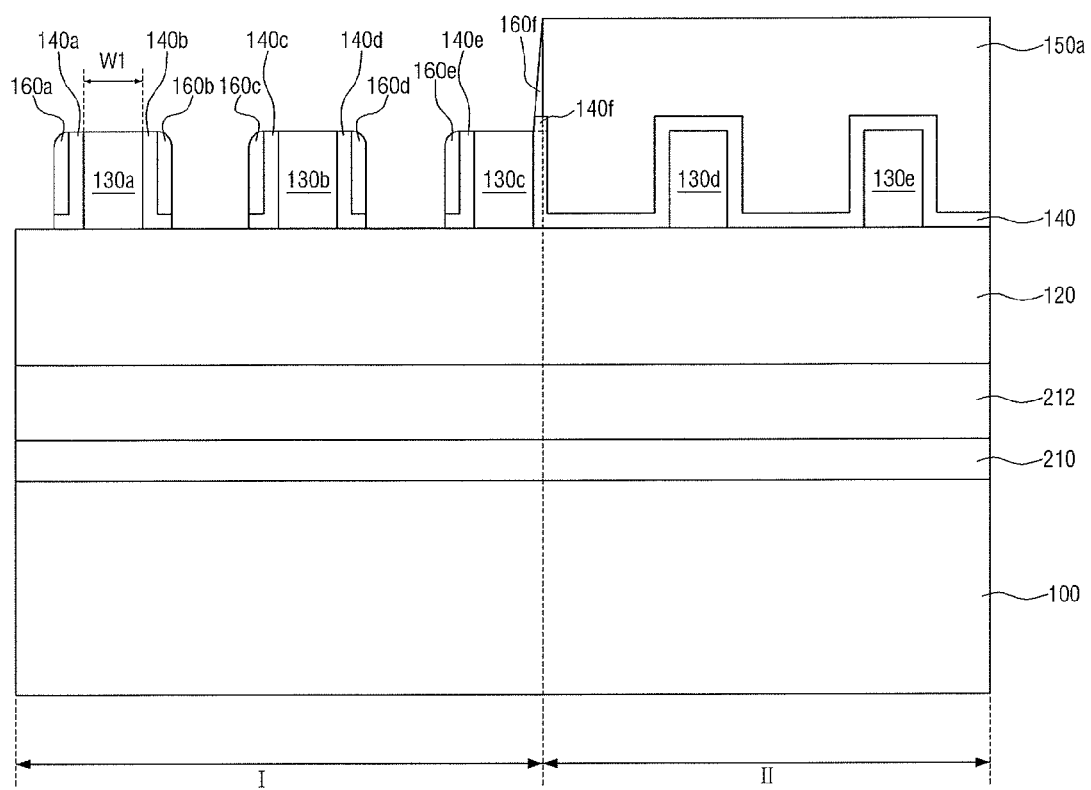

Referring to FIG. 20, the second insulation layer 160 is etched. For example, the second insulation layer 160 formed on the first insulation layer 140 is etched in the first region I and the second insulation layer 160 formed on the photoresist pattern 150a is etched in the second region II.

As the second insulation layer 160 is etched, a portion thereof formed on the top surface of each of the features of the first mold pattern 130a to 130e is removed. Portions thereof formed on the side walls of each of the features of the first mold pattern 130a to 130e may not be removed. Part of the first insulation layer 140 may be etched together during the process of etching the second insulation layer 160.

Accordingly, in the first region I of the first hardmask layer 120, first spacer patterns 140a to 140e and second spacer patterns 160a to 160e may be formed on the side walls of each of the features of the first mold pattern 130a to 130c, respectively. The first spacer pattern 140a to 140e and the second spacer pattern 160a to 160e may be used for forming a DPT pattern in the first region I in a subsequent process.

In addition, there may be formed a residual part 160f of the second insulation layer 160 on a part 140f of the first insulation layer 140. The first region I and the second region II may be separated by the residual part 160f of the second insulation layer 160 as well as the boundary of the photoresist pattern 150a.

Figure 21:
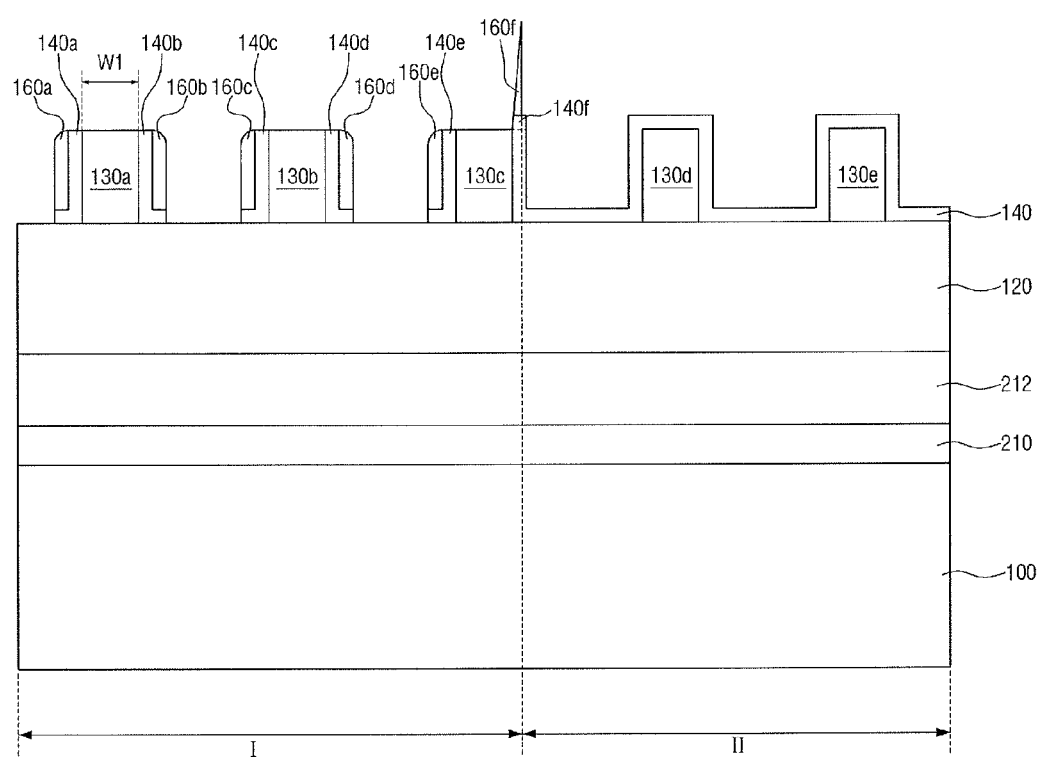

Referring to FIG. 21, the photoresist pattern 150a is etched out. As a result, the first insulation layer 140 is exposed in the second region II. Part of the first insulation layer 140 may be etched together during etching the photoresist pattern 150a.

Figure 22:
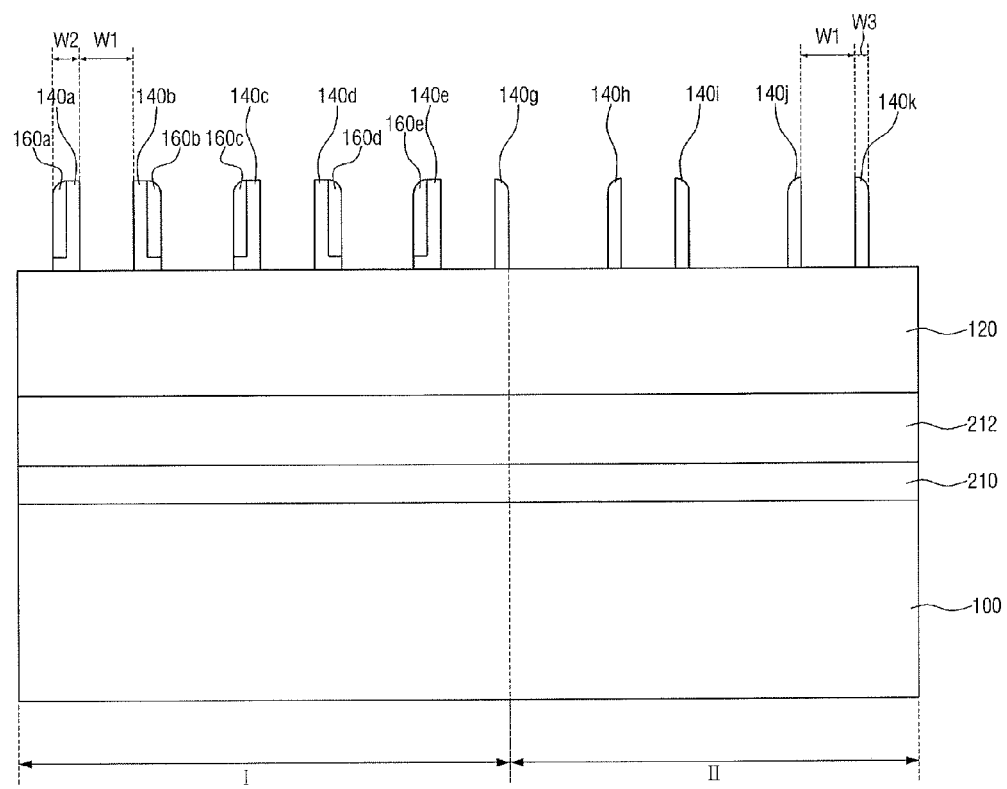

Referring to FIG. 22, the first mold pattern 130a to 130e is removed for forming a DPT pattern. As a result, in the first region I, the top surface of the first hardmask layer 120 is exposed between a pair of features of the first spacer pattern 140a and the second spacer pattern 160a and a pair of features of the second spacer pattern 140b and the second spacer pattern 160b, between the pair of the features of the first spacer pattern 140b and the second spacer pattern 160b and a pair of features of the first spacer pattern 140c and the first spacer pattern 160c, and so on. In the second region II, the top surface of the first hardmask layer 120 is exposed between every two features of the first spacer pattern 140h to 140k.

Dry etching, wet etching or aching processes may be used to remove the first mold pattern 130a to 130e.

As described above, the removed features of the first mold pattern 130a to 130e have the width of W1, the pairs of the features of the first spacer patterns 140a to 140e and the features of the second spacer pattern 160a to 160e have the width of W2, and the features of the first spacer pattern 140h to 140k have the width of W3. Such spacer patterns may determine the width of a feature or a pitch between features of the DPT patterns in a subsequent process, allowing for various sizes of DPT patterns.

Thus, the present embodiment may cover a method for making a semiconductor device which includes forming a plurality of first spacers 140a to 140e in a first region and forming a plurality of second spacers 160a to 160e in a second region adjacent to the first region. Each of the first spacers includes a portion of a first insulation layer and a portion of a second insulation layer. Each the second spacers 160a to 160e includes a portion of the first insulation layer without a portion of the second insulation layer. Each of the second spacers 160a to 160e is wider than each of the first spacers 140a to 140e. The first spacers and the second spacers may correspond to double patterning technology (DPT) patterns. The portion of the second insulation layer overlaps the portion of the first insulation layer in each of the first spacers. The first spacers are spaced by a first distance and the second spacers are spaced by the first distance. The first distance may be greater than a width of each of the first spacers 140a to 140e and a width of the second spacers 160a to 160e.

As illustrated in FIG. 22, the first spacers and the second spacers may also be arranged to have different pitches and different widths between respective pairs of first spacers and second spacers, as formed by different portions of a hardmask layer. The hardmask layer portions (e.g., see FIG. 12) may extend in a first direction perpendicular to a second direction in which the spacers are arranged. The hardmask layer portions may have different widths, e.g., W2 and W3 as illustrated, for example, in FIG. 12.

Figure 23:
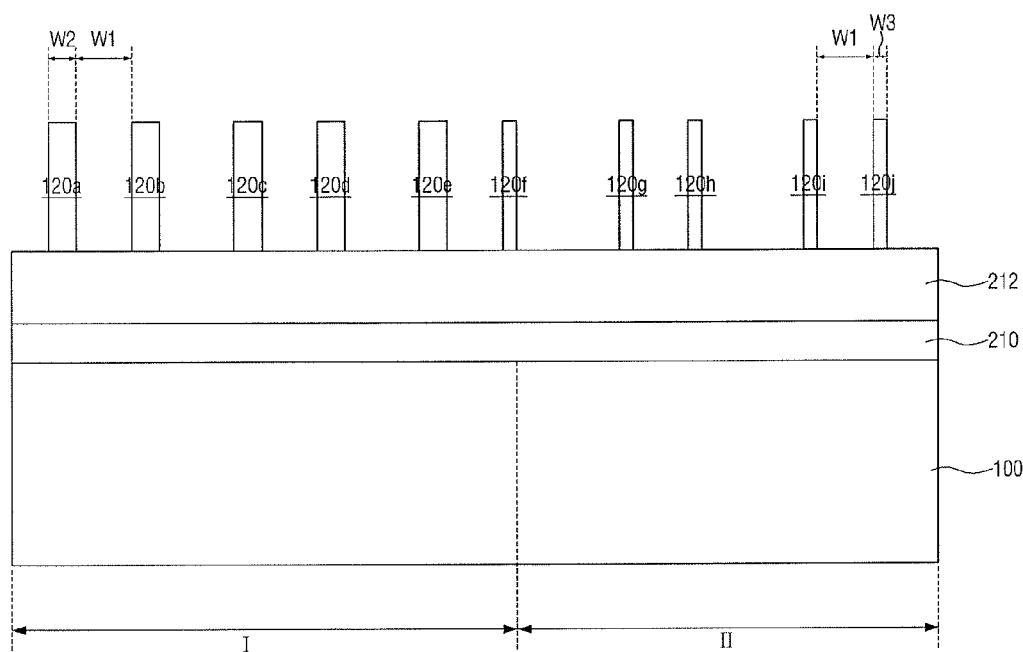

Referring to FIG. 23, the first spacer pattern 140a to 140e and the second spacer pattern 160a to 160e are used as etch masks in the first region I, and the first spacer pattern 140h to 140k are used as an etch mask in the second region II. The first hardmask layer 120 is etched by anisotropic dry etching to thereby form a first hardmask pattern 120a to 120j.

Figure 24:
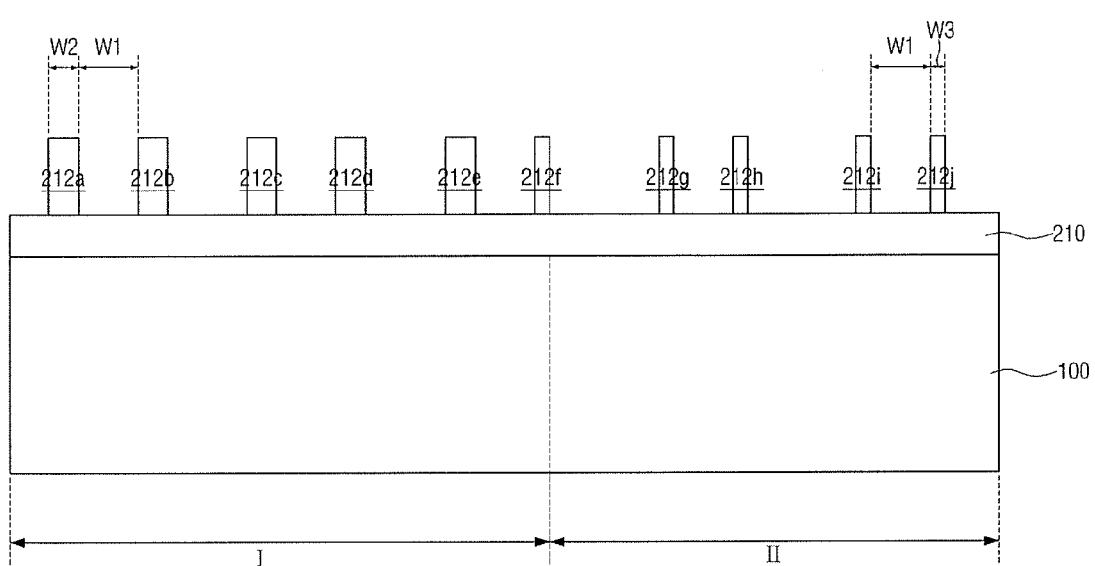

Referring to FIG. 24, the nitride film 212 is etched by anisotropic dry etching using the first hardmask pattern 120a to 120j as an etch mask, thereby forming a nitride film pattern 212a to 212j.

Figure 25:
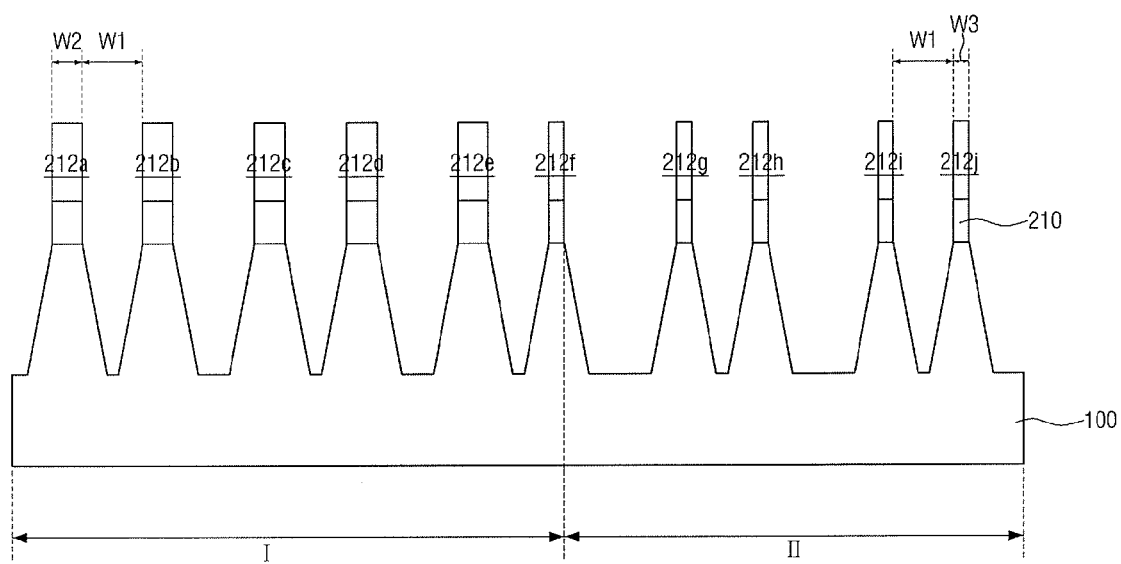

Referring to FIG. 25, the pad oxide film 210 and the substrate 100 is etched by anisotropic dry etching using the nitride film pattern 212a to 212j as an etch mask. As a result, trenches having the pitch of W2 are formed in the first region I and trenches having the pitch of W3 are formed in the second region II.

Figure 26:
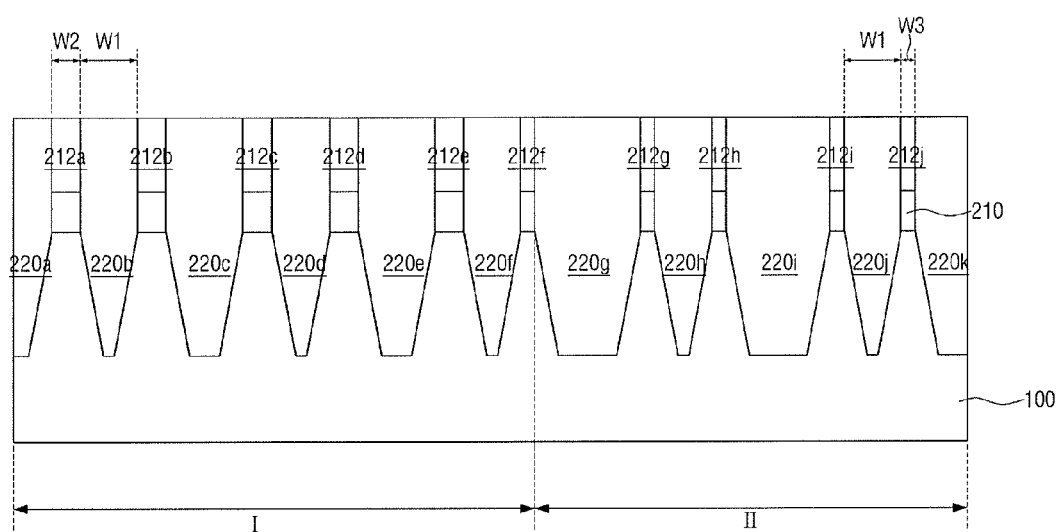

Referring to FIG. 26, an insulative material is deposited in the trenches having the pitch W2 in the first region I, in the trenches having the pitch W3 in the second region II and on the nitride film pattern 212a to 212j. Subsequently, the insulative material is planarized via a chemical mechanical polishing (CMP) process to form device isolation layers 220a to 220k in the trenches.

Thus, according to the present embodiment, by performing an additional photolithography process, after the first insulation layer 140 working as spacer material for the first DPT is formed, different sizes of fine patterns may be formed in a desired region.

Figure 27:
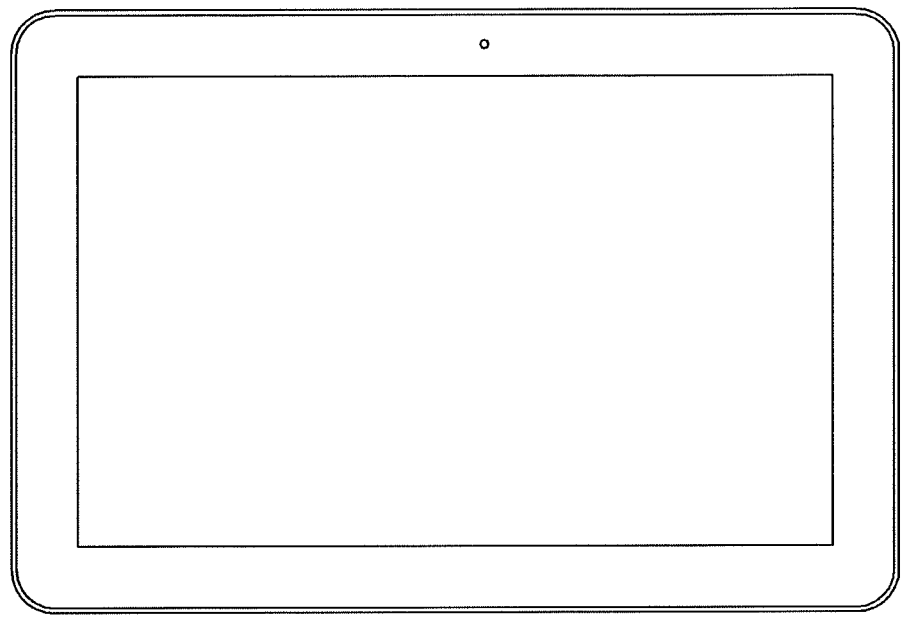
FIGS. 27 to 29 illustrate various embodiments of a semiconductor system.
Figure 28:
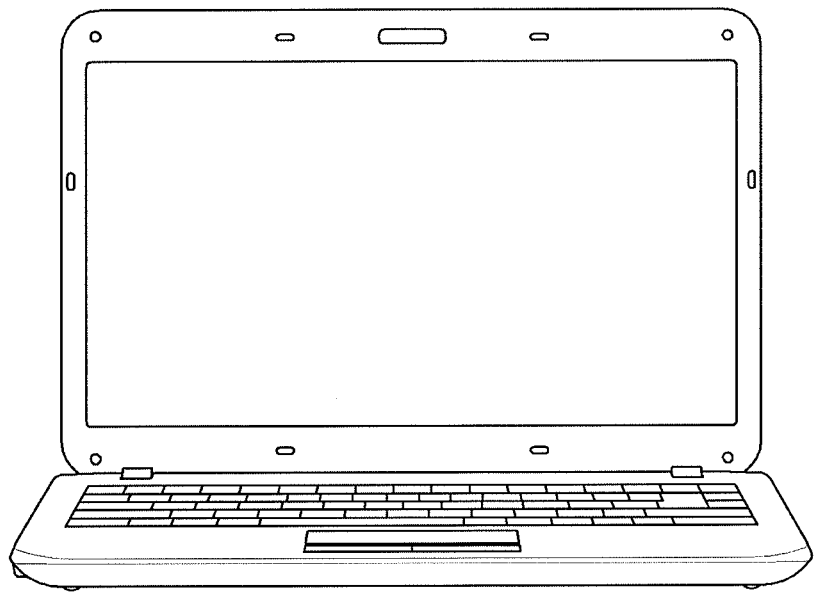
Figure 29:
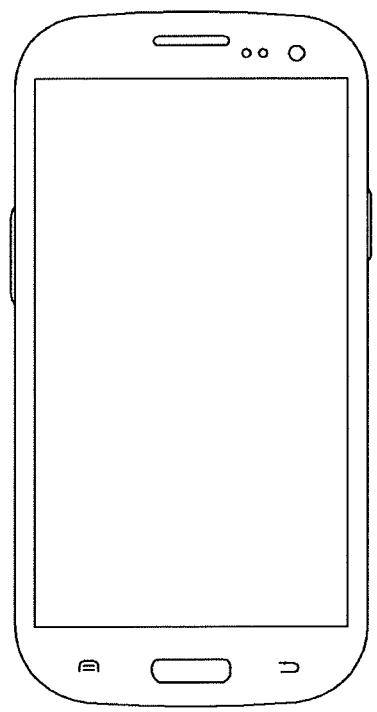

FIGS. 27 to 29 show embodiments of a semiconductor system, which, for example, may include semiconductor devices made according to the aforementioned embodiments. A tablet PC 1200 is illustrated in FIG. 27. W laptop computer 1300 is illustrated in FIG. 28. A smartphone 1400 is illustrated in FIG. 29.

The semiconductor devices may be employed by integrated circuit devices than those mentioned above. For example, while the tablet PC 1200, the laptop computer 1300, and the smartphone 1400 have been mentioned as examples of the semiconductor device, the semiconductor device may be implemented as the following in other embodiments: a computer, UMPC (Ultra Mobile PC), a workstation, a net-book, a PDA (Personal Digital Assistants), a portable computer, a wireless phone, a mobile phone, an e-book, a PMP (portable multimedia player), a portable game console, a navigation device, a black box, a digital camera, a 3-dimensional television, a digital audio recorder, a digital audio player, a digital picture recorder, a digital picture player, a digital video recorder, a digital video player, etc.

Example embodiments have been disclosed herein, and although specific terms are employed, they are used and are to be interpreted in a generic and descriptive sense only and not for purpose of limitation. The embodiments, or certain aspects thereof, may be combined to form additional embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood that various changes in form and details may be made without departing from the embodiments set forth in the claims.

What is claimed is:

1. A method for manufacturing a semiconductor device, the method comprising:
    forming features of a first mold pattern on a substrate including a first region and a second region;
    forming a first insulation layer covering the first mold pattern from the first region to the second region;
    forming a photoresist pattern on the first insulation layer in the second region;
    forming a second insulation layer covering the first insulation layer in the first region and the photoresist pattern in the second region from the first region to the second region;
    etching the second insulation layer;
    removing the photoresist pattern; and
    forming a first double patterning technology (DPT) pattern having a first width in the first region and a second DPT pattern having a second width in the second region, wherein the second width is different from the first width.

2. The method as claimed in claim 1, wherein the first width of the first DPT pattern is greater than the second width of the second DPT pattern.

3. The method as claimed in claim 1, wherein etching the second insulation layer includes removing only a portion of the second insulation layer adjacent to side surfaces of the photoresist pattern, and wherein the region where the first DPT pattern is formed is separated from the region where the second DPT pattern is formed by a residual portion of the second insulation layer, which remains after the photoresist pattern is removed.

4. The method as claimed in claim 1, wherein after the photoresist pattern is removed:
    the first region includes a plurality of first spacers, each of the first spacers including a portion of the first insulation layer and a portion of the second insulation layer, and the second region includes a plurality of second spacers, each of the second spacers including a portion of the first insulation layer only.

5. The method as claimed in claim 4, wherein:
the first DPT pattern has a width equal to a width of the first spacers, and
the second DPT pattern has a width equal to a width of the second spacers.

6. The method as claimed in claim 4, further comprising:
forming a second mold pattern between the first spacers and between the second spacers.

7. The method as claimed in claim 6, wherein the first DPT pattern includes:
a feature having a width equal to a width of the first mold pattern, and
a feature having a width equal to a width of the second mold pattern.

8. The method as claimed in claim 6, wherein the second DPT pattern includes:
a feature having a width equal to a width of the first mold pattern, and
a feature having a width equal to a width of the second mold pattern.

9. The method as claimed in claim 6, wherein:
a pitch between features of the first DPT pattern is equal to a width of the first spacers, and
a pitch between features of the second DPT pattern is equal to a width of the second spacers.

10. The method as claimed in claim 1, wherein:
the substrate includes a layer to be etched, and
the method includes:
etching the layer to be etched in the first region using the first DPT pattern as an etch mask; and
etching the layer to be etched in the second region using the second DPT pattern as an etch mask.

11. The method as claimed in claim 10, wherein the layer to be etched includes a conductive layer, an insulation layer, or a combination thereof.

12. A method for manufacturing a semiconductor device, the method comprising:
forming features of a mold pattern on a substrate including a first region and a second region;
forming a first insulation layer covering the mold pattern from the first region to the second region;
forming a photoresist pattern on the first insulation layer in the second region;
forming a second insulation layer covering the first insulation layer in the first region and the photoresist pattern in the second region from the first region to the second region;
etching the second insulation layer;
removing the photoresist pattern; and
forming first trenches having a first pitch in the first region and second trenches having a second pitch in the second region, wherein the second pitch is different from the first pitch.

13. The method as claimed in claim 12, wherein the first pitch between the first trenches is greater than the second pitch between the second trenches.

14. The method as claimed in claim 12, wherein:
etching the second insulation layer includes removing only a portion of the second insulation layer adjacent to side surfaces of the photoresist pattern, and
the region where the first trenches having the first pitch are formed is separated from the region where the second trenches having the second pitch are formed by a residual portion of the second insulation layer which remains after removing the photoresist pattern.

15. The method as claimed in claim 12, wherein after the photoresist pattern is removed:
the first region includes a plurality of first spacers, each of the first spacers including a portion of the first insulation layer and a portion of the second insulation layer, and
the second region includes a plurality of second spacers, each of the second spacers including a portion of the first insulation layer only.

16. A method for manufacturing a semiconductor device, the method comprising:
forming features of a mold pattern on a substrate;
forming a first insulation layer covering the mold pattern over the substrate;
forming a first photoresist pattern in a second region of the substrate;
forming a second insulation layer over the first photoresist pattern and the first insulation layer;
etching to remove the second insulation layer and the first photoresist pattern in the second region and to leave a portion of the second insulation layer over a portion of the first insulation layer in a first region;
forming a second photoresist pattern in the second region of the substrate;
forming a third insulation layer over the substrate;
etching the third insulation layer and the second photoresist pattern;
forming a first double patterning technology (DPT) pattern having a first width in the first region and a second DPT pattern having a second width in the second region; and
forming a third DPT pattern having a third width in another region of the substrate.

17. The method as claimed in claim 16, wherein one or more layers in the first region extend into the second region.

18. The method as claimed in claim 16, wherein the first region does not overlap the second region.

19. The method as claimed in claim 16, wherein the first width of the first DPT pattern, the second width of the second DPT pattern, and the third width of the DPT pattern are different from one another.

20. The method as claimed in claim 16, wherein:
the substrate includes a layer to be etched, and
the method includes:
etching the layer to be etched in the first region using the first DPT pattern as an etch mask; and
etching the layer to be etched in the second region using the second DPT pattern as an etch mask.

* * * * *